US008476684B2

(12) United States Patent
Coyne et al.

(10) Patent No.: US 8,476,684 B2
(45) Date of Patent: Jul. 2, 2013

(54) FIELD EFFECT TRANSISTORS HAVING IMPROVED BREAKDOWN VOLTAGES AND METHODS OF FORMING THE SAME

(75) Inventors: Edward John Coyne, Limerick (IE); Paul Malachy Daly, Limerick (IE); Jagar Singh, Limerick (IE); Seamus Whiston, Limerick (IE); Patrick Martin McGuinness, Limerick (IE); William Allan Lane, Cork (IE)

(73) Assignee: Analog Devices, Inc., Norwood, MA (US)

( * ) Notice: Subject to any disclaimer, the term of this patent is extended or adjusted under 35 U.S.C. 154(b) by 318 days.

(21) Appl. No.: 12/893,794

(22) Filed: Sep. 29, 2010

(65) Prior Publication Data
US 2012/0074493 A1 Mar. 29, 2012

(51) Int. Cl.
H01L 29/76 (2006.01)
H01L 21/335 (2006.01)

(52) U.S. Cl.
USPC ............. 257/288; 438/291; 257/E29.012; 257/E21.4

(58) Field of Classification Search
USPC ........... 257/288, E29.012, E21.4; 438/291
See application file for complete search history.

(56) References Cited

U.S. PATENT DOCUMENTS 3,764,864 A * 10/1973 Okumura et al. ............. 257/362
5,091,763 A * 2/1992 Sanchez ........................ 257/344
5,212,106 A * 5/1993 Erb et al. ...................... 438/289
5,371,401 A * 12/1994 Kurita ........................... 257/524
5,432,366 A * 7/1995 Banerjee et al. .............. 257/327
5,576,574 A * 11/1996 Hong ............................ 438/291
5,668,024 A * 9/1997 Tsai et al. ..................... 438/199
5,757,045 A * 5/1998 Tsai et al. ..................... 257/336
5,912,490 A * 6/1999 Hebert et al. ................. 257/340
6,084,269 A 7/2000 Davies et al.
6,159,814 A * 12/2000 Gardner et al. ............... 438/305
6,248,652 B1 * 6/2001 Kokubun ...................... 438/585
6,365,475 B1 * 4/2002 Cheng et al. .................. 438/306
6,707,118 B2 * 3/2004 Muljono et al. .............. 257/392
6,882,009 B2 * 4/2005 Ker et al. ...................... 257/349
2003/0116785 A1 6/2003 D'Anna et al.
2003/0209758 A1 * 11/2003 Lee et al. ...................... 257/336
2007/0087500 A1 4/2007 Son et al.
2008/0237707 A1 * 10/2008 Suzuki et al. ................. 257/344
2010/0121404 A1 * 5/2010 Bjorling et al. ................ 607/28
2010/0155858 A1 * 6/2010 Chen ............................. 257/402
2010/0163986 A1 7/2010 Kim

FOREIGN PATENT DOCUMENTS
EP 0 730 293 9/1996

OTHER PUBLICATIONS

Search Report and Written Opinion in PCT/US2011/052794, dated Jan. 6, 2012.
Written Opinion of the International Preliminary Examining Authority in PCT Appl. No. PCT/US2011/052794, dated Sep. 28, 2012, 7 pages.
Baliga, "Silicon RF Power Mosfets", World Scientific, 2005, Chapter 4 Lateral-Diffused MOSFETs, 33 pages.

* cited by examiner

Primary Examiner — Evan Pert
(74) Attorney, Agent, or Firm — Knobbe Martens Olson & Bear LLP

(57) ABSTRACT

Transistors having improved breakdown voltages and methods of forming the same are provided herein. In one embodiment, a method of forming a transistor comprises the steps of: forming a drain and a source by doping a semiconductor with a first dopant type to form a first type of semiconductor, the drain and source being separated from one another, wherein the drain comprises a first drain region of a first dopant concentration adjacent a second drain region, such that at least a portion of the second drain region is positioned between the first drain region and the source, and further comprising forming an intermediate region by doping the semiconductor so as to form a second type of semiconductor intermediate the drain and source, the intermediate region spaced apart from the second drain region.

19 Claims, 14 Drawing Sheets

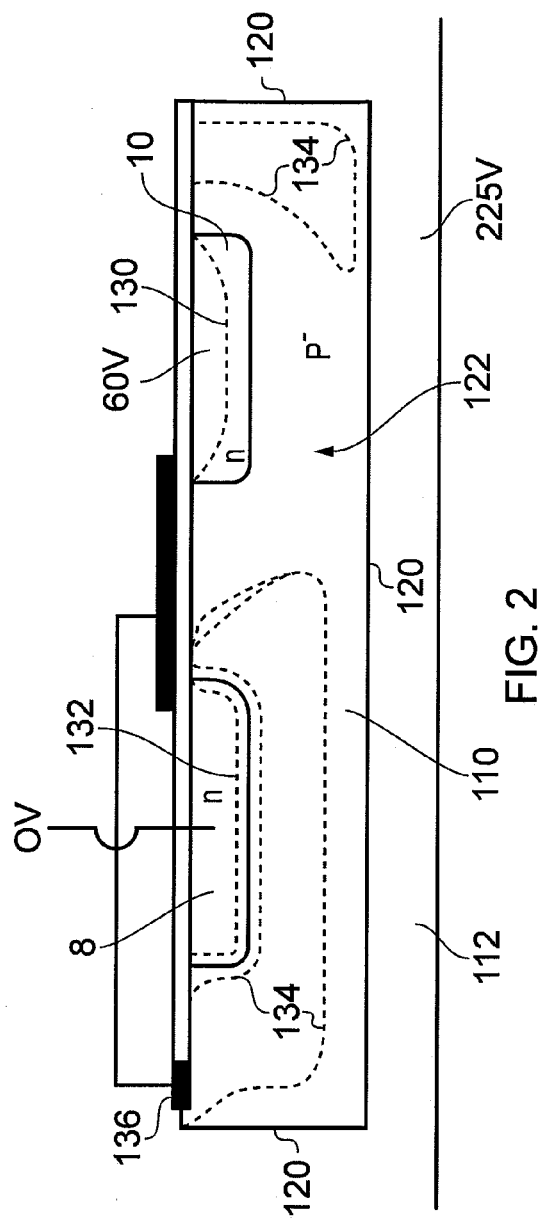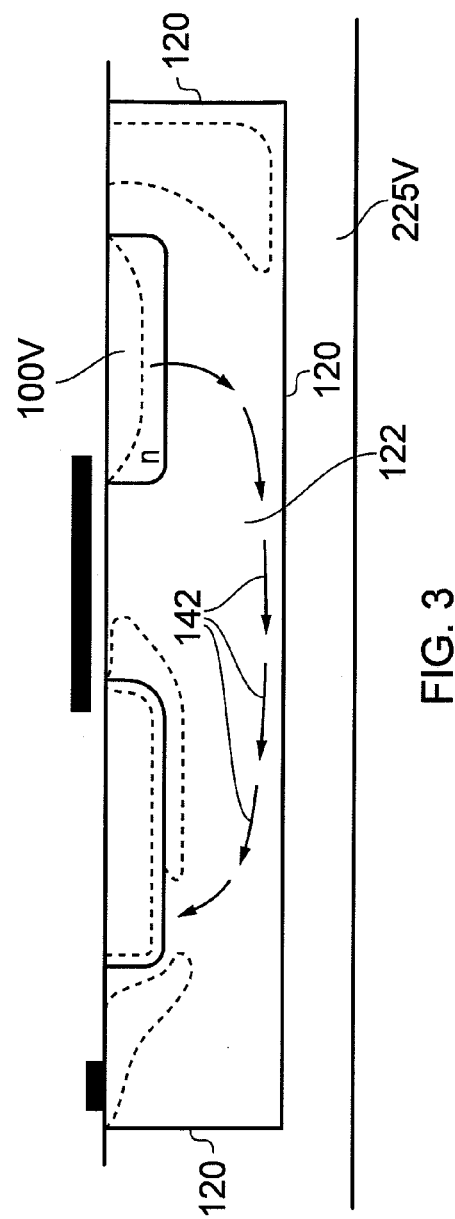

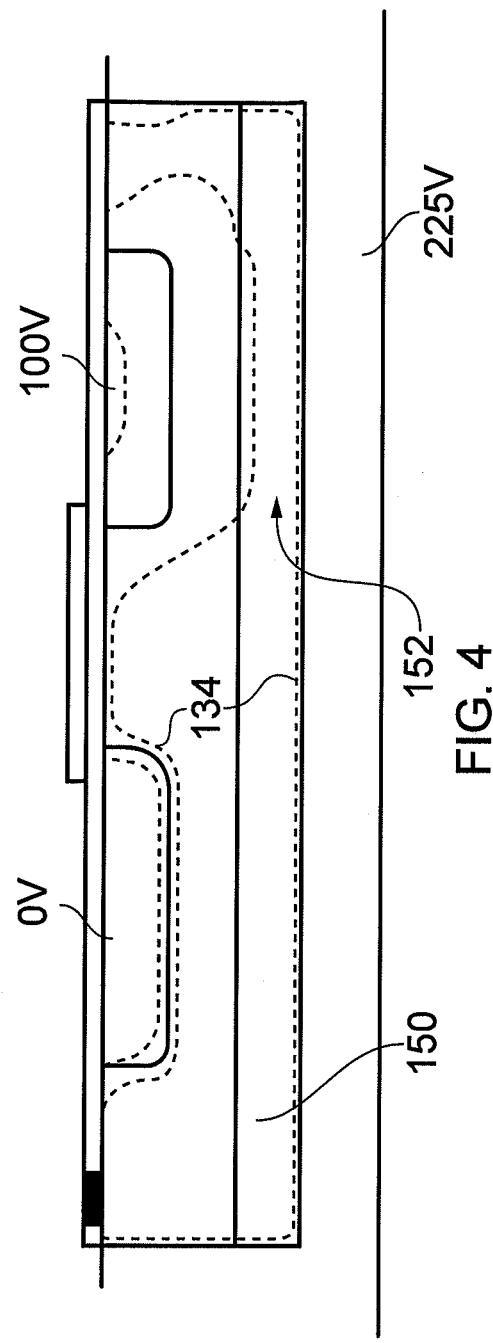

FIELD EFFECT TRANSISTORS HAVING IMPROVED BREAKDOWN VOLTAGES AND METHODS OF FORMING THE SAME

BACKGROUND

1. Field of the Invention

The present invention relates to transistors having improved breakdown voltages, and to methods of forming the same.

2. Description of the Related Art

Certain electronic systems can include field-effect transistors. Field-effect transistors can have a breakdown voltage, such as a source-drain breakdown voltage, which can indicate the maximum voltage which can be applied to the transistor without sustaining damage. A relatively low breakdown voltage can limit the voltage conditions under which a transistor can operate.

There is a need for transistors having improved breakdown voltages. Furthermore, there is a need for methods of forming transistors having improved breakdown voltages.

SUMMARY

According to a first aspect of the present invention there is provided a method of forming a transistor, the method comprising: forming a drain and a source by doping a semiconductor with a first dopant type to form a first type of semiconductor, the drain and source being separated from one another, wherein the drain comprises a first drain region of a first dopant concentration adjacent a second drain region, such that at least a portion of the second drain region is positioned between the first drain region and the source; and further comprising forming an intermediate region by doping the semiconductor so as to form a second type of semiconductor intermediate the drain and source, the intermediate region spaced apart from the second drain region.

In certain embodiments described herein, the structure of a transistor can be modified relative to a conventional transistor so as to increase its breakdown voltage. In embodiments of methods taught herein, such higher voltage transistors can be formed at the same time and using the same process that is used to form other transistors within an integrated circuit. Thus the high voltage transistors do not incur the additional cost of utilizing a dedicated high voltage process merely to form the high voltage transistors.

The transistor may be, for example, a NMOS, a PMOS, or any other suitable field-effect transistor device, and may be arranged to work in enhancement mode or depletion mode. Furthermore the devices may be symmetric such that the drain and source terminals can be interchanged or asymmetric where the device has a preferred drain region or terminal and a preferred source region or terminal.

The transistor further comprises a gate.

In certain embodiments, the transistor is formed in a junction isolated well. In other embodiments, the transistor utilizes insulated wells where a region of silicon is isolated from other transistors by an insulator.

According to some embodiments, a relatively heavily doped region is formed adjacent or in the bottom of a well defining the transistor. This can help to inhibit potential differences between the source, drain or gate, and the substrate beneath and around the well forming a depletion region within the well of material.

In accordance with certain embodiments, at least the drain, and optionally the source, has a plug of relatively highly doped material extending from a region of contact with a metallic conductor. This can reduce current crowding near the surface of the device.

According to a second aspect of the present invention there is provided a field effect transistor comprising a drain region and a source region formed of a first type of semiconductor, and wherein the drain region comprises a first drain region of a first dopant concentration adjacent a second drain region, such that at least a portion of the second drain region is positioned between the first drain region and the source region, and further comprising an intermediate region of a second type of semiconductor intermediate the drain and source regions and spaced apart from the second drain region.

According to a third aspect of the present invention there is provided a method of forming a transistor, the method including forming a well having a doping of a first type and a first doping concentration, forming a source and a drain in the well, the source and drain having a doping of a second type opposite that of the first type and spaced apart by a first distance, and forming an intermediate region in the well between the source and drain, the intermediate region having a doping of the first type. The intermediate region has a second doping concentration greater than the first doping concentration, and is disposed between the source and drain and spaced apart from the drain by a second distance. The method further includes forming a gate electrode above the intermediate region.

BRIEF DESCRIPTION OF THE DRAWINGS

The present invention will now be described, by way of non-limiting example, with reference to the accompanying Figures, in which:

FIG. 2 is a schematic cross section of a prior art NMOS device formed within a well of material that it is insulated from the remainder of the silicon substrate by insulating walls provided as part of a silicon on insulator (SOI) process, and showing simulated depletion region boundary positions;

FIG. 3 shows depletion regions within the device shown in FIG. 2, but undergoing voltage induced breakdown;

FIG. 4 is a schematic cross section through a NMOS field effect transistor in accordance with an embodiment of the present invention;

DETAILED DESCRIPTION OF EMBODIMENTS

Figure 1:
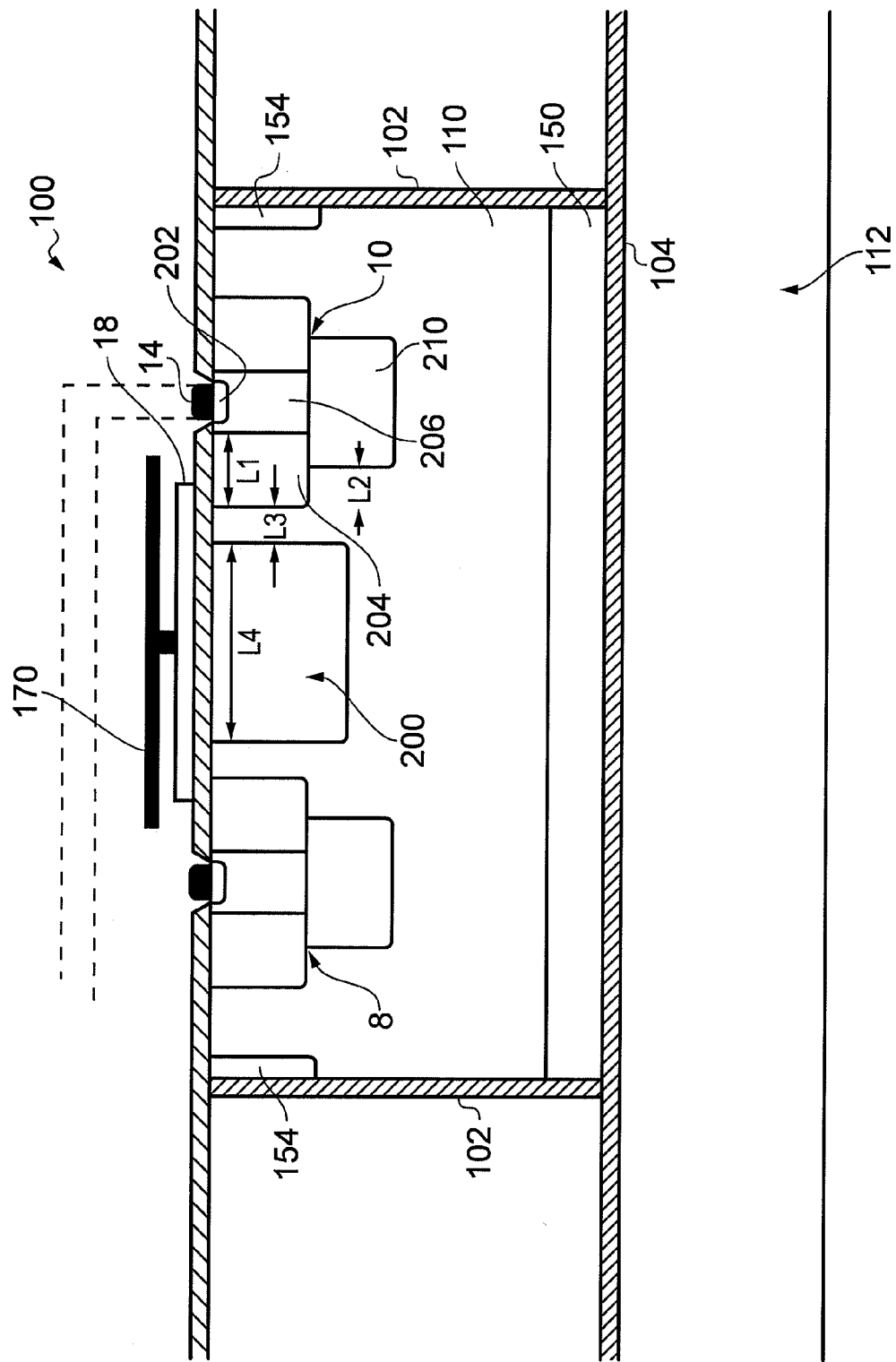
FIG. 1 is a schematic cross section through an NMOS field effect transistor in accordance with a first embodiment of the invention.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Figure 14:
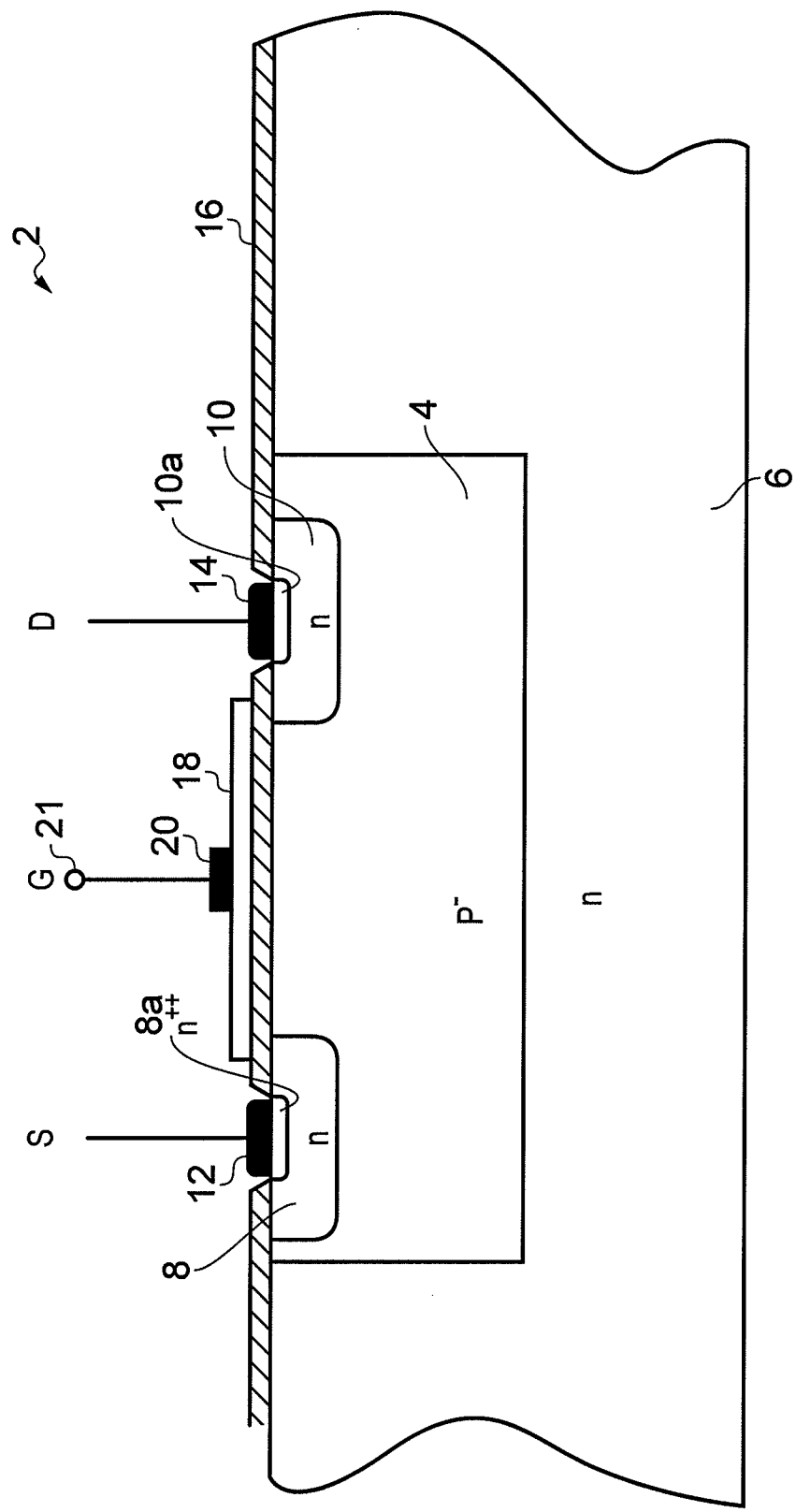
FIG. 14 illustrates a prior art NMOS transistor.

FIG. 14 schematically illustrates the structure of a prior art NMOS field effect transistor, generally designated 2. The NMOS device comprises a well 4 of lightly P-doped semiconductor designated by the sign p⁻ formed within a N-type substrate 6 designated "n". Source and drain regions of N-type semiconductor (which in this example represents a first type of semiconductor) 8 and 10 are formed in the well region 4. Each of the source, S, and drain, D, regions has a contact region 8a and 10a, respectively, of highly doped material designated n⁺⁺ in order to facilitate making a good electrical connection to metal electrodes 12 and 14. The surface of the device is covered with an oxide layer 16, except in the regions of the metal electrodes 12 and 14. The oxide layer provides the surface of the transistor 2 with both chemical and environmental protection.

A gate electrode 18, typically of poly-silicon, is formed over the oxide layer 16 and extends between the source and drain regions 8, 10, and as shown in FIG. 14 partially overlaps each of them. The gate electrode 18 is connected to a metallic contact 20 such that a control voltage can be applied to the gate. A further connection (not shown) is generally made between the gate 18 and the semiconductor well region 4 such that the material in the well region 4 is at the same potential as the gate, and is often described as forming a "back-gate".

In use, when the gate 18 is held at a positive voltage with respect to the source 8, the p⁻ region in the vicinity of the gate 18 becomes depleted of holes such that the remaining material behaves as if it is N-type material, thereby forming an n channel, that extends between the source and the drain, thereby allowing a current to flow.

As is well known to the person skilled in the art in reality the channel is not uniformly subjected to electric field gradients along its length. In fact, the vast majority of the channel is at a voltage similar to the source voltage and the bulk of the drain-source potential difference is concentrated across a relatively small region of semiconductor at the boundary of the channel and the drain. This observation holds true in both the conducting and non-conducting states of the device.

An important parameter of the device can be its breakdown voltage. This specifies the voltage, in this example the drain-source voltage $V_{DS}$ that a device can withstand without damage.

Semiconductor manufacture can be a competitive business, and in order to maximize their yields of products, certain manufacturers and fabricators of transistors have various standard "processes" that define the operating voltages and other characteristics of transistors.

Thus, for example, a fabrication facility may offer a "40 volt" process which guarantees that transistors fabricated by that process will operate at 40 volts. Each process has standard building blocks which come as part of the process and which can be used in the fabrication of, for example, millions of transistors on a wafer.

For example, a 40 volt process can have a P implantation step, an N implantation step, and an EPI (epitaxial) growth step, each of which can have a standard processing time and doping profile. The standardization of steps within a process can increase manufacturing efficiency.

A device manufacturer or silicon fabricator generally has a range of processes available to them for fabricating transistors having different breakdown voltages.

Processes for high voltage devices can have drawbacks relative to process for devices having a lesser breakdown voltage. For example, a high voltage device process can produce devices having increased leakage current, larger device size, reduced speed or other performance issues relative to a low voltage process. The performance issues of a high voltage process can render the high voltage process unsuitable for use in certain applications. Low voltage processes may produce transistors with faster switching times or improved linearity for signal processing, but which cannot accommodate higher breakdown voltages. In certain applications, such as those in which speed and density of packing are important, a manufacturer typically will select the process having the lowest acceptable voltage.

Whilst it is possible to mix processes on a single substrate, this can come at significantly increased financial and processing cost due to a variety of factors, such as the additional processing steps required, particularly where additional masking steps are needed. The majority of the wafer is masked whilst processing steps are applied to only a small area of the wafer in order to form higher voltage transistors. Thus the cost to form a handful of transistors may be approximately the same as the cost to form millions of transistors within a single wafer. The additional processing steps also incur a failure rate, which can decrease the yield of functional circuits formed on a wafer.

It can be beneficial to produce transistors having a first breakdown voltage using fabrication steps of a process that has a second breakdown voltage that is lower than the first breakdown voltage. Thus, a low voltage process may be used to fabricate transistors having a higher breakdown voltage than would otherwise be expected. The use of the low voltage process to produce higher voltage transistors permits higher voltage transistors to be formed simultaneously with the normal or bulk transistors of the device, thereby reducing processing costs.

Returning to FIG. 14, suppose that the N type regions of the source and drain are fabricated using a 40 volt process which has a "standard" N-type doping step, such that the N-type regions have as standard a first concentration of dopant atoms therein. For example, this concentration can be around $10^{15}$ donor atoms per $cm^3$. This standard doping concentration is typically employed for sources and drains for NMOS devices across the chip, such that there may be no N-type implanted regions with lower doping concentrations. Higher doping concentrations might be employed for "plug" and a "contact" doping profiles with dopant concentrations of about $10^{18}$ and $10^{20}$ atoms per $cm^3$, respectively. The process can include an Epitaxial growth and doping step. The above figures are for approximate guidance only but show that the concentration density between one region and another may vary by a hundred or a thousand times.

By offering only a few standard doping operations in each process the transistor designer's freedom of choice can be reduced in the interests of efficiency of manufacture.

As noted above, typically most of the voltage drop in the N-type FET occurs at the edge of the drain region where it faces the channel. Thus, to a first approximation any range of drain-source separations which result in a substantially working transistor can produce transistors having similar breakdown voltages. Thus, even if the distance between the drain and source regions of the device shown in FIG. 14 is increased significantly, the breakdown voltage can remain relatively unaltered and can be about 60 volts for a 40 volt process. However, increasing the drain-source separation can significantly increase the on state resistance $R_{on}$ of the device.

FIG. 1 schematically shows an embodiment of a transistor, in this example an NMOS field effect transistor, constituting an embodiment of the present invention and exhibiting a breakdown voltage significantly in excess of that normally expected of transistors fabricated using the same fabrication process. To put this in context, using a 40 volt process the inventors have managed to fabricate transistors having breakdown voltages in excess of 130 volts, and indeed up to 220 volts. Thus, in certain embodiments, the breakdown voltage is in excess of about 3 times the nominal process voltage. Furthermore, the breakdown voltage can be at least double the expected breakdown voltage of transistors fabricated using the "process" offered by the semiconductor foundry.

There are several features in the structure of the device shown in FIG. 1 which help the enhanced breakdown voltage to be achieved, and which also allow device performance to be maintained. Where features have been previously described with respect to another figure the same reference numeral may be reused in the description.

A field effect transistor uses electric fields to control the conductive properties of the transistor. The electric field extending from the gate electrode into the semiconductor in the well that forms the body of the transistor can be used to control the conductivity of the device. For example, as shown in FIG. 1, the electric field extending from the gate electrode can create a depletion region in the well, which can aid in forming the channel of the device, the channel extending between the source and drain regions and being the region through which current flow occurs.

As will be described in further detail below, in certain embodiments, when forming relatively high breakdown voltage devices from lower voltage processes, additional precautions can be used to prevent and/or reduce undesired current flow.

Comparing the device shown in FIG. 1 with that shown in FIG. 14, a well 110 of p⁻ material within the body of the substrate has been bounded by insulating walls 102 and a lower insulating surface 104. The insulating walls 102 and the lower insulating surface 104 can be provided in accordance with processes known to the skilled artisan, such as in certain silicon on insulator (SOI) processes. In certain embodiments, the insulated well 110 of p⁻ material is provided above the substrate 112 to electrically isolate the well from the substrate. However, in other embodiments, a well can be isolated from the substrate by reverse biasing the pn junctions present between the well and substrate. Depending on a variety of factors, such as the device type and characteristics, it can be desirable to employ a plurality of wells, such as by forming a first well within a second well, to aid in obtaining pn junctions suitable for electrically isolating the well from the substrate.

However, silicon on insulator fabrication may not be sufficient to guarantee operation of the device if the transistor designer has no control over the voltages applied to the substrate 112 relative to that of the transistor. For example, the transistor designer may have no control of the voltage applied to the substrate 112 relative to that of the source voltage. Large potential differences between the substrate and the source, or indeed the gate 18, can give rise to the creation of a depletion region moving upwardly (with increasing voltage) from the insulating layer 104 and also inwardly from the side walls if the material around the well is at substantially the same potential as the material beneath the well.

In the context of this application relative spatial terms such as side, top, bottom, beneath, above and so on refer to the relative positions of features within a device when the device is orientated as shown in the corresponding Figure or Figures.

FIG. 2 shows by way of example a prior art NMOS device, but formed in a P-type well 110 bounded by insulating walls 120. The N-type source region 8 is connected to zero volts whereas the drain region is connected to a +60 volts supply, all voltages being measured with respect to the source voltage. The gate voltage is at zero volts. The substrate 112 is held at 225 volts. The insulating walls 120 stop current flow between the P well and the substrate 112 but may not prevent the formation of electric fields within the transistor as a result of the potential difference. As is known to the person skilled in the art, the formation of a pn junction sets up a region known as a "depletion region" where the concentration gradients of dissimilar dopants on either side of the pn junction gives rise to a counter balancing electric field gradient. The extent of the depletion region depends on the dopant densities; as the dopant density on a side of the boundary increases, the depletion region becomes more confined close to the nominal pn boundary on that side. By contrast, lightly doped semiconductor material can have quite spatially extensive depletion regions, even in the presence of relatively modest potential differences applied across the pn junction.

When, as shown in FIG. 2, the drain 10 is at 60 volts and the substrate 112 is at 225 volts, the depletion region extending downward from the drain 10 meets and forms part of the depletion region extending upwardly from the bottom of the device, as generally designated by reference numeral 122.

Chain line 130 represents the edge of the depletion region within the drain 10. Chain line 132 represents the boundary of the depletion region within the source 8, and chain line 134 represents the edge of the depletion region resulting from the connection of the back-gate 136 to the p⁻ material in the well. In this example the transistor is notionally symmetrical when viewed from above except that the back-gate connection, which is a point-like connection, is made only at one place. The non-depleted region of the p⁻ well material as delimited by the region enclosed by the chain line 134 extends like a torus around the device and hence exists on the left hand side and right hand sides of the cross section through the device as shown in FIG. 2.

As the drain potential increases, the potential of the depleted region 122 also increases since it has been depleted of holes and hence behaves like a region of N-type material forming an extension of the drain region. Without being limited by theory, it is believed that this increase in potential causes the depletion region around the edge of the source to become progressively thinned until such time as the electric field gradient is high enough to overcome the breakdown voltage in the vicinity of the source and consequently a current flow path is opened up as indicated by the arrows 142 in FIG. 3.

The primary cause of the off-state breakdown is the upward growth of the depletion region from the bottom of the transistor giving rise to a region of high potential beneath the source.

In certain embodiments, the growth of the depletion region from the bottom of the transistor can be inhibited by a formation of a doped buried layer 150, as shown in FIGS. 1 and 4, which represent embodiments of the invention. The doped buried layer 150 can inhibit the upward growth of the depletion region from the bottom of the device and the downward growth of the depletion region beneath the drain. Thus, a non-depleted region 152, as shown in FIG. 4, enclosed by depletion region boundaries 134, extends beneath the active region of the device (the drain-gate-source region), thereby inhibiting this particular breakdown mechanism.

As noted above, the depletion region can also extend from the side walls. In one embodiment, plugs 154 are formed around the periphery of the device, as shown in FIG. 1.

The buried layer 150 and plugs 154, (which in the three-dimensional device can effectively form a surrounding curtain) can be formed by P-type material with a relatively high dopant concentration.

A further source of undesirable electric field can result from routing metallic connectors over the transistor. For example, metal connectors are routed over a device exhibiting rotational symmetry. In such devices, the drain may be a central island of material which is encircled by the gate electrode, and hence the channel, which in turn is encircled by the source. As noted herein "encircled" does not imply that the electrodes are circular, but merely that they substantially loop around so as to substantially enclose (in two-dimensions) another area. In such a configuration, the metallic connection to the drain passes over part of the gate. The connection to the drain can be at an unknown but potentially high voltage, and thus may create an electric field gradient around the conductor, with the electric field gradient potentially extending into the channel and thereby altering the shape or size of the depletion region within the channel and hence the device characteristics.

In order to overcome this effect, a screening element, e.g. a screen, can be formed between the gate and the conductor passing over the gate region. The screen may be a metalized region placed above the gate electrode 18 so as to shield the gate from electric field gradients. The screen may be held at a fixed voltage or connected to the gate such that no electric field gradient exists between the screen and the gate electrode. This is shown in FIG. 1 by the provision of a metal layer 170 above the poly-silicon gate 18 but connected to the gate and overhanging the gate. The approaches described above can be applied adjacent any suitable transistor to increase its breakdown voltage. Although the metal layer 170 is illustrated in FIG. 1 as overhanging the gate, in certain embodiments, the metal layer 170 need not overhang the gate.

In the formation of a high voltage device, it can be important to control the growth and/or shape of depletion regions between and/or adjacent the source and drain regions so as to prevent the formation of excessive field gradients within the active region of the device. Approaches for controlling the shape of the depletion region within the active (sometimes known as intrinsic region) of the device will now be described. These approaches give rise to a modification of the dopant profiles within a device.

In one embodiment, in order to provide an improved breakdown voltage a region of P-type material is deposited between, but not adjoining, the source and drain regions. As this additional implantation is formed in the channel and is intermediate the drain and source, it can be regarded as an intermediate region. In this exemplary NMOS device the intermediate region is a P-type region. In other embodiments the intermediate region may "touch" the source, but does not abut or contact the drain. In the NMOS example discussed in more detail below, n-type doping or semiconductor material represents a first type of doping or semiconductor material while p-type doping or semiconductor represents a second type of doping or semiconductor material; however, the skilled artisan will readily appreciate that references herein to first and opposite second doping types can refer to n-type and p-type, respectively, or to p-type and n-type respectively.

In FIG. 1 it can be seen that the intermediate region 200 is formed in the channel under the gate 18 and is spaced apart from the drain 10 and, because this embodiment is a symmetrical device, the intermediate region 200 is also spaced from the source 8. The spacing will be discussed in greater detail later.

In one embodiment, the contact of the drain 10 can define, at least near the surface of the drain, a first drain region 202, which can also be considered to be a central region. The drain 10 has a second drain region 204 that extends laterally, that is towards and optionally away, from the source 8 by a distance L1. This second drain region 204 is doped at a lower concentration compared to the first (central) region 202 of the drain. Thus, the first drain region can be formed as an area of increased doping concentration within the second drain region. The lateral extent L1 of this relatively lightly doped region 204 allows spreading of the depletion region. This allows the electric field resulting from the potential difference between the drain and source terminals to be spread over a larger distance, thus reducing the electric field gradient. Thus, the distance from the first region 202 of the drain to the edge of the lightly doped N region formed around the first drain region 202 is substantially defined by the distance L1 and the width of the spacing or gap between the edge of the N-type drain 10 (and particularly the edge of the second drain region 204) and the edge of the intermediate channel region 200 is defined by distance L3.

A further enhancement is to form a "plug" of relatively high concentration material, defining a third drain region 206 extending downwardly from the metallic contact 14, and beneath the first region 202, and at substantially the same vertical extent or penetration into the semiconductor as the relatively lightly doped region second drain region 204. The increased spatial extent of the region of high doping reduces the tendency of current density to increase at the upper surface of the device around the first drain region 202. The formation of high current densities can give rise to stripping of carriers from atoms thereby giving rise to more carriers which in turn gives rise to an even higher current density, and so on, resulting in an avalanche driven on-state breakdown mechanism which is driven by the interaction between electric field gradients and current density. By providing a larger region of high doping the current collecting region of the drain 10 extends over an increased depth and hence the current densities are decreased at the boundary of the third drain region 206 and this gives rise to an increased on-state breakdown voltage.

In one embodiment, the doping concentration of the first drain region 202 is greater than the doping concentrations of the second drain region 204 and third drain region 206, and the doping of the third drain region 206 is greater than the doping concentration of the second drain region 204. Thus, the third drain region 206 can be formed as an area of increased doping concentration within the second drain region 204, and the first drain region 202 can be formed as an area of further increased doping concentration within the second and third drain regions 204 and 206. By doping the first, second and third drain regions in this manner, the third drain region 206 can increase on-state breakdown voltage while the second doped region 204 can permit spreading of the depletion region as described above.

Current density can be controlled by spreading of the depletion region. The depletion region can spread in both the horizontal and vertical directions. Controlling the vertical spreading of the depletion region beneath the source and drain regions 8, 10, particularly the drain 10, can reduce the tendency of current to crowd into those regions near the surface of the semiconductor device at the region where the drain faces towards the channel.

In order to control spreading, in one embodiment a relatively lightly N doped fourth drain region 210 is formed beneath the first and/or third drain region 206, and the lateral extent of this lightly doped region is less than that of the second drain region 204. Thus, as shown in the cross sectional view of FIG. 1, the second drain region 204 overhangs the fourth drain region 210 on the side facing towards the channel and the source 8. It is not critical whether the second drain region 204 overhangs the fourth drain region 210 on the side facing away from the channel. The width of the overhang is designated by distance L2. Because this device is symmetrical, the doping structure of the source 8 is the same as the drain 10, and hence has first to fourth source regions that match the first to fourth drain regions 202-210.

The intermediate region 200 in the illustrated NMOS device is formed by a well of P-type material having a width L4. This width L4 underlies the gate 18 and predominantly defines the length of the channel. This intermediate region 200 confers a number of operational advantages to the finished device.

Firstly, the intermediate region 200 can provide enhanced protection against punch through. Punch through occurs when the width of the depletion region around the drain (but extending towards the source) and the width of the depletion region around the source (but extending towards the drain) sum to equal the drain to source separation, such that a continuous depleted region extends from the source to the drain. This intermediate region 200 being of relatively high doping density counteracts the tendency of the depletion region to extend due to the lower doping of the second drain region 204 around the first drain region 202.

This approach is counterintuitive as the person skilled in the art generally is taught that the way to reduce the problem of punch through is to increase bulk doping levels, whereas in this device the bulk (i.e. doping of well 110) dopant levels can be unaltered.

Employing this technique permits the device to be physically smaller, because the doped region 200 has a relatively high dopant concentration, and spreading of a depletion region around the edge of the region 200 (but within it) is inhibited.

Being relatively highly doped—compared to the P-type well 110, including the spacing between the intermediate region 200 and the drain 10—the intermediate region 200 has more current carriers available to carry the drain-source current and hence gives a reduction in the on state resistance $R_{DSon}$.

Additionally, the intermediate region 200 allows the device threshold voltage to be controlled. The gate voltage, being positive compared to the source voltage causes "holes" to be pushed away from the gate, giving rise to an inversion region where electrons predominate, giving rise to the formation of the channel. The modification of the doping concentration in the channel relative to the P-well 110 doping levels allows the inversion effect to be tailored, giving control of the threshold voltage. This technique can be used to control the behavior of enhancement mode and depletion mode devices.

The effect of these features have been investigated, both by simulation and experimentation in order to characterize device performance. In certain embodiments, the use of the intermediate region 200 can provide additional benefits and/or features in addition to those described above.

Figure 5:
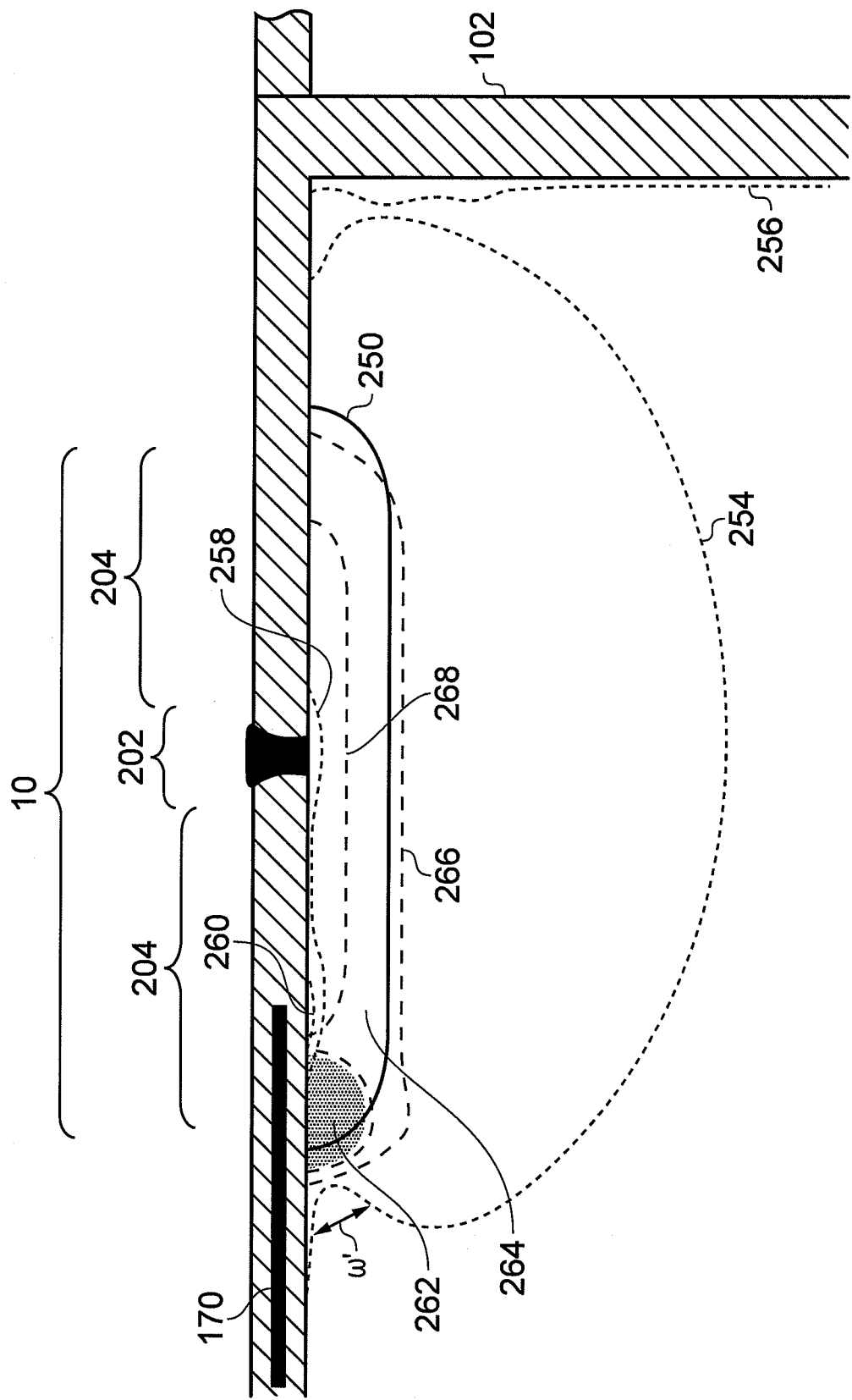
FIG. 5 diagrammatically illustrates the depletion region boundaries and electric field gradient densities in the drain of a transistor in accordance with an embodiment of the present invention.

FIG. 5 shows a simulation of the drain region 10 of a transistor having the first drain region 202 formed within the second drain region 204. In contrast to the drain shown in FIG. 2, the doping of second drain region 204 can be kept deliberately relatively low. The notional boundary of the second drain region 204 is denoted by solid line 250. The drain voltage for the simulation was 200V. Depletion region boundaries are denoted by chain line 254 extending beneath the drain and towards the gate region; chain line 256 adjacent the insulating wall 102 as a result of a potential difference between the transistor being considered and the silicon on the other side of the wall 102; chain line 258 near the first region of semiconductor material; and chain line 260 indicating the formation of an unwanted depletion region as a result of the electric field gradients spilling over the edge of the gate screen 170. The Figure also schematically illustrates two regions 262 and 264 of relatively high electric field gradients, where those gradients will eventually trigger a breakdown of the device as the drain-source voltage increases. Region 262 is the region of highest electric field and marks a volume of semiconductor where the field gradient may reach as much as $1.6 \times 10^4$ Volts per cm, as shown as a shaded region in FIG. 5. Region 264 bounded by chain lines 266 and 268 has a lower electrostatic field gradient, but it is still higher than that experienced by the rest of the device. However, it can be seen that as region 264 extends some distance from the contact at the first drain region 202 towards the gate, it drops a portion of the drain-source voltage, thereby increasing the overall breakdown voltage of the device.

Figure 6:
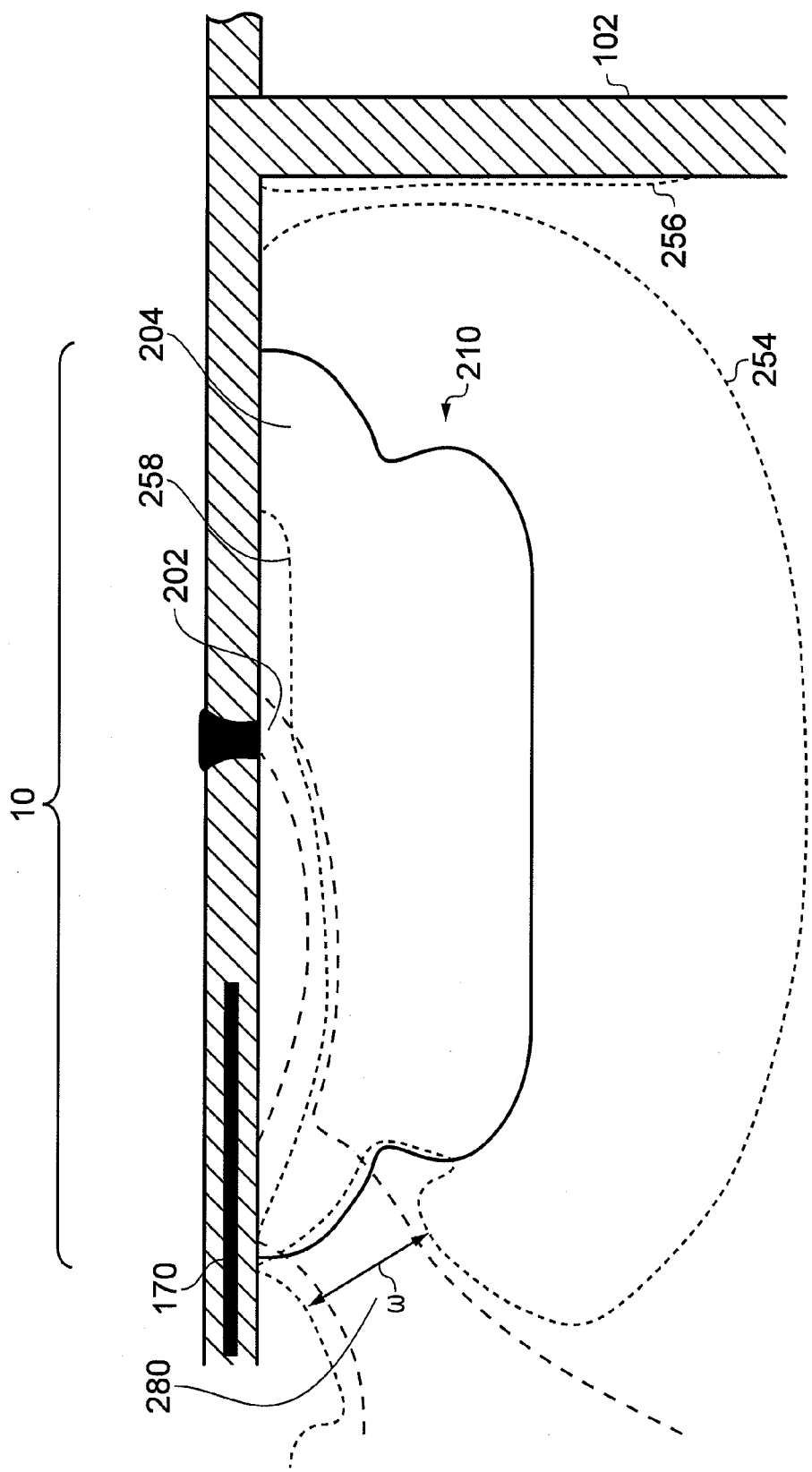
FIG. 6 shows the drain region of a transistor in accordance with another embodiment of the invention, and also schematically illustrating simulated current densities.

Moving on to FIG. 6, the device structure of FIG. 5 is modified by the inclusion of the fourth drain region 210 beneath the first and second drain regions 202 and 204.

In this Figure, as in FIG. 5, the edges of the implanted regions are shown as being rounded. This dopant profile, as known to the person skilled in the art, results from the device being doped by ion implantation from above by placing the silicon substrate, after being suitably masked, in the path of an energetic ion beam. The ions penetrate the silicon, but the ion concentrations tend to be greatest near the surface of the wafer. In order to address this, the device can undergo heating to promote thermal diffusion of the implanted ions over a diffusion distance, which distance can be modified by controlling the heating temperature and heating time. The effect of such diffusion is to "round off" the edges of implanted regions.

FIG. 6 shows current densities rather than electrostatic potentials, but it does also show depletion region boundaries. Comparing FIGS. 5 and 6 it can be seen that an undepleted region 280 adjacent the edge of the second drain region 210 is much wider, as indicated by arrow W than the equivalent region indicated by arrow W' in the embodiment shown in FIG. 5. This wider undepleted region 280 permits a larger volume of silicon to be used to conduct the drain-source current.

Figure 7:
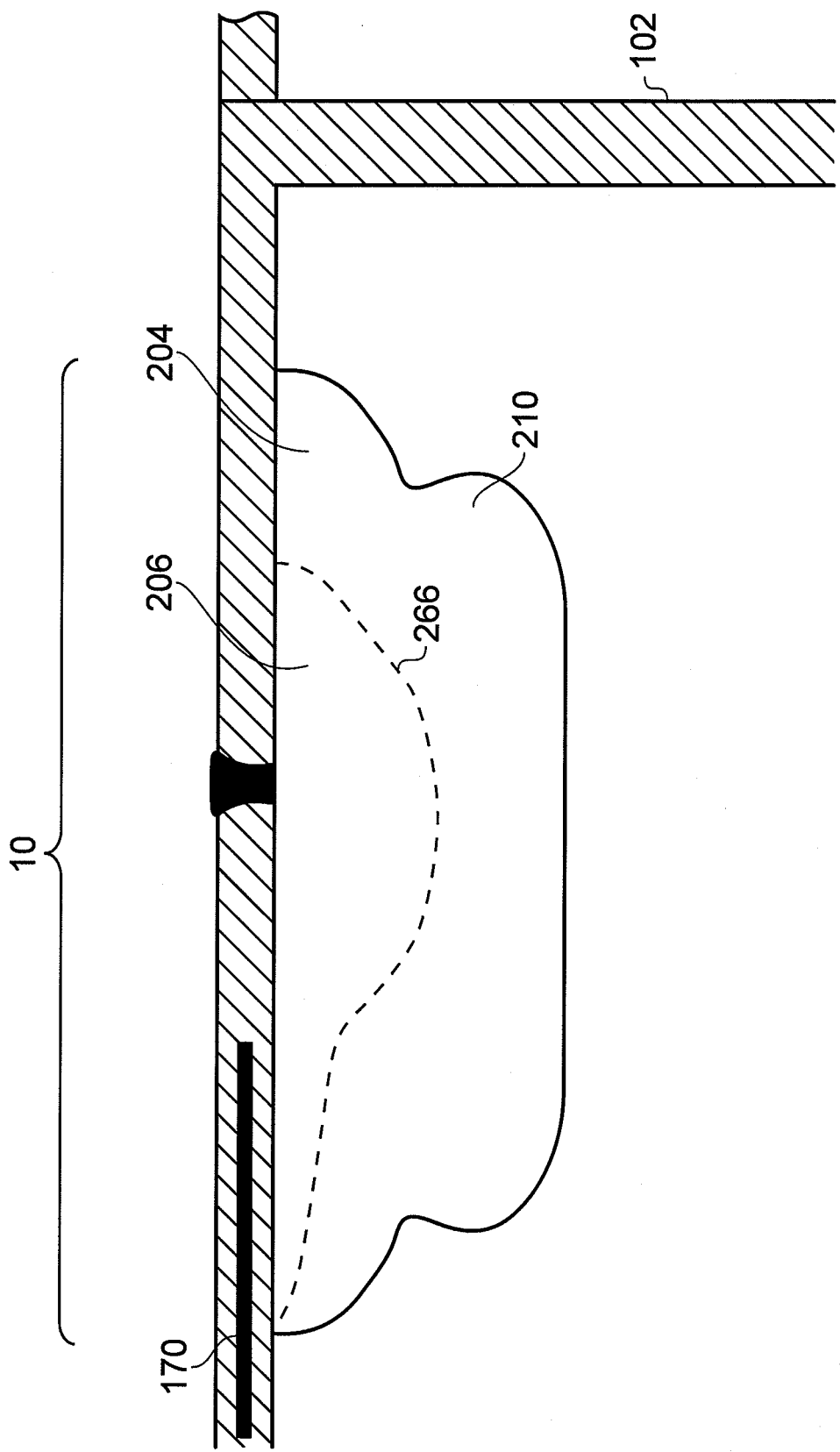
FIG. 7 shows the drain region of a transistor in accordance with a further embodiment of the present invention in which a plug of a semiconductor having relatively high doping concentration is provided beneath the metallic contact, the Figure shows the modification of the depletion region boundary as a result of the provision of the plug.

FIG. 7 shows a further modification to the arrangement of FIG. 6, with the third region 206 of the drain being included such that a high dopant density "plug" extends downwardly to the top of the fourth region 210. This figure shows that with the addition of the plug or third drain region 206, the volume of silicon for conduction is even larger and therefore reduces high current densities occurring at high voltages.

The plug forms a region of high dopant concentration at the source and drain contacts into the silicon that has the net effect of moving the region of highest current density away from the contact corner. The plug increases the volume of silicon available to the current for conduction and therefore reduces the current density, which in turn reduces impact ionization at the contacts, while decreasing the series resistance of the device.

Figure 8:
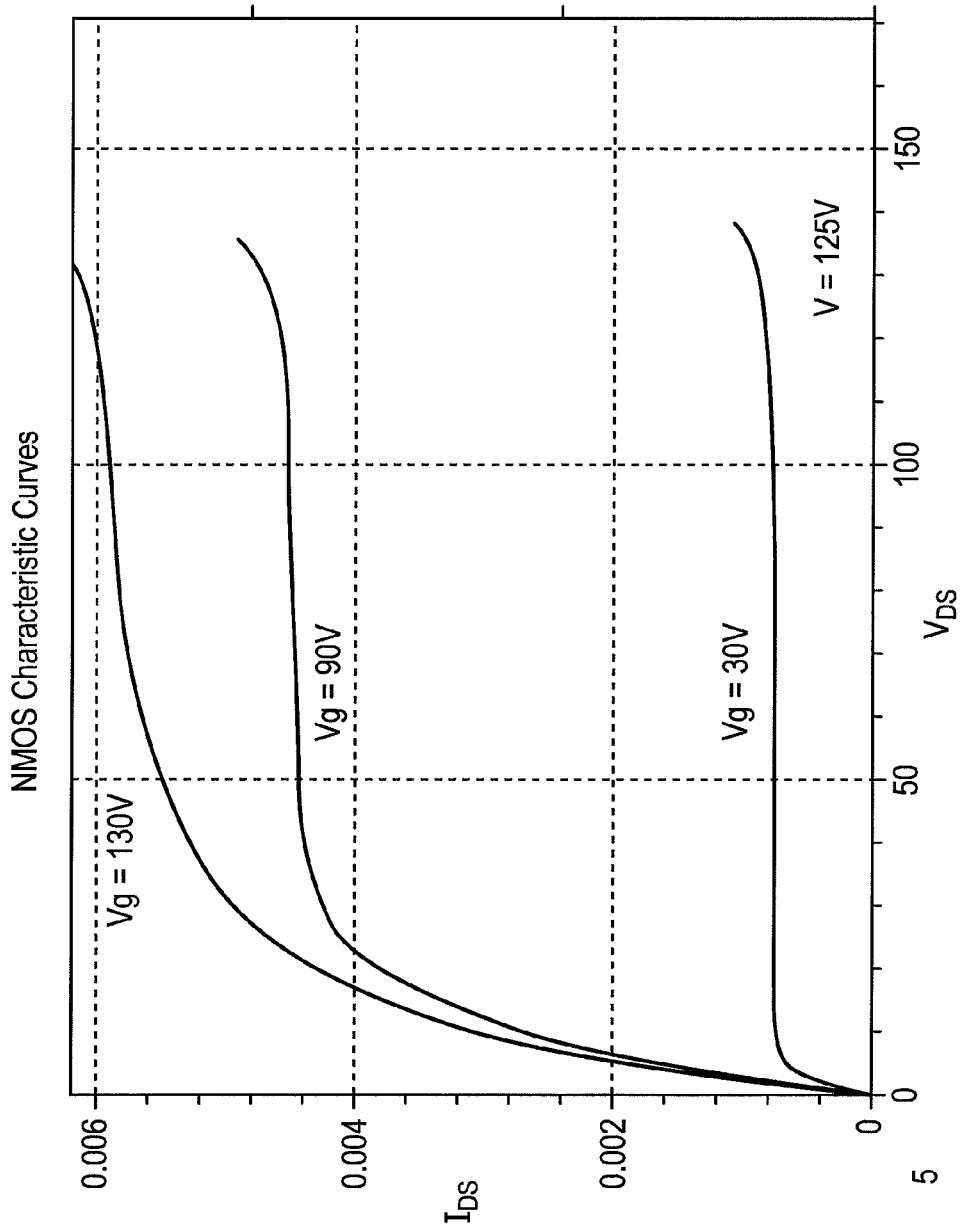
FIG. 8 shows $I_{DS}$ versus $V_{DS}$ characteristic curves for one example of a device in accordance with an embodiment of the present invention.

FIG. 8 shows a family of characteristic curves for a test device fabricated with the following dimensions: L1=7 µm, L2=2 µm, L3=2 µm, L4=4 µm, doping in the first drain region $202=1\times10^{21}$ cm$^{-3}$, doping in the second drain region $204=5\times10^{15}$ cm$^{-3}$, doping in the third drain region $206=1\times10^{18}$ cm$^{-3}$, doping in the fourth drain region $210=5\times10^{15}$ cm$^{-3}$, doping in the intermediate region $200=1\times10^{16}$ cm$^{-3}$, and doping in bulk region $110=1\times10^{15}$ cm$^{-3}$.

It can be seen that, broadly speaking, the doping in the second drain region 204 is over 10,000 times less concentrated that in the first drain region 202. Doping in the third drain region 206 is over 100 times more concentrated than the doping in the second drain region 204. Doping in the fourth drain region 210 is similar in concentration to the doping in the second drain region 204. The second and fourth drain regions 204, 210 are approximately 5 to 20 times more heavily doped than the bulk material (body) or well 110 of the transistor.

When employing the schemes described herein, for a device fabricated using a 40 volt process, it can be seen that breakdown voltages in excess of 130 volts are achieved. The characteristics are plotted for various gate-source voltages $V_{GS}$.

Initially when $V_{GS}$=90V a current flow $I_{DS}$ of around 4.4 mA is established. However when $V_{GS}$ is decreased to about 30 V the current flow drops to around 0.8 mA.

For $V_{GS}$=130 V the characteristic moves from the triode region of the device to the pinch off region at around 40 volts, and exhibits a small incremental resistance as $V_{DS}$ increases.

Returning to FIG. 1, in one embodiment, the device is fabricated by using a P doped wafer having the SOI layers 104 and insulating walls 102 formed above the substrate. The relatively heavily doped P-type buried layer 150 can be provided by having the wafer pre-doped at that dopant concentration. From the buried layer 150 the wafer initially extends up as far as the bottom of the fourth drain region 210. The wafer can be lightly n doped to reduce the free carrier concentration for the bulk material in the well 110 down to P$^-$ concentration levels, or the layer above the buried layer 150 may be epitaxially grown onto the buried layer 150 and doped to the required P$^-$ level.

From here the drain structures 210, 204, 206, 200 and plugs 154 can be formed as a series of steps resulting from epitaxial growth of silicon onto the wafer and doping steps, as will be apparent to the person skilled in the art. The transistor can be built from the bottom up, and hence it is possible to define the width and position of, for example, the fourth drain region 210 by masking and implantation steps, before proceeding to form (grow, mask and dope) the second and third drain regions above the fourth drain region. Thus, the dimensions L1, L2 and L3 can all be defined by masks during the construction of the transistor and hence under control of the device designer. Similarly the size L4 of the intermediate region 200 can also be controlled by a mask used in conjunction with a doping step.

Figure 9:
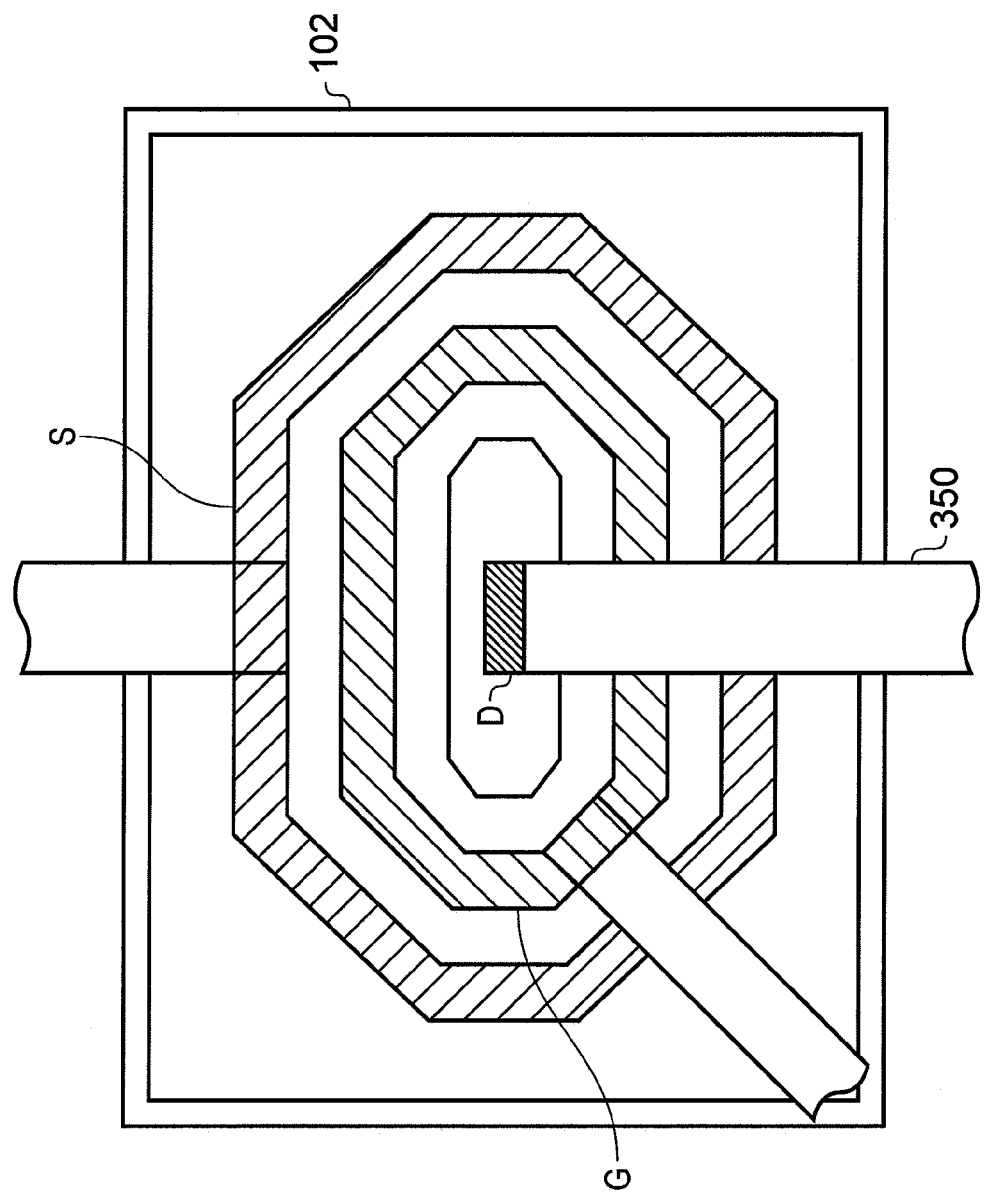
FIG. 9 shows a transistor in accordance with an embodiment of the invention in plan view.

FIG. 9 shows the plan view of an alternative, rotationally symmetric version of the transistor shown in FIG. 1. The drain, gate and source electrodes and labeled D, G and S, respectively. The plan view shows that, in the completed symmetric device, a metallic interconnect 350 used to form a conductive connection to the drain electrode passes over the gate and source regions. Hence, the screen/shield 170 as shown in FIG. 1 can be of use in preventing a drain voltage induced field penetrating into the gate region.

The devices described thus far have been described as being symmetric in that the source and drain structures have had the same doping profiles and structures, when viewed in cross section as schematically shown in FIG. 1. However, persons of ordinary skill in the art will appreciate that the teachings described herein can be applied to any suitable device, including certain asymmetric devices.

Figure 10:
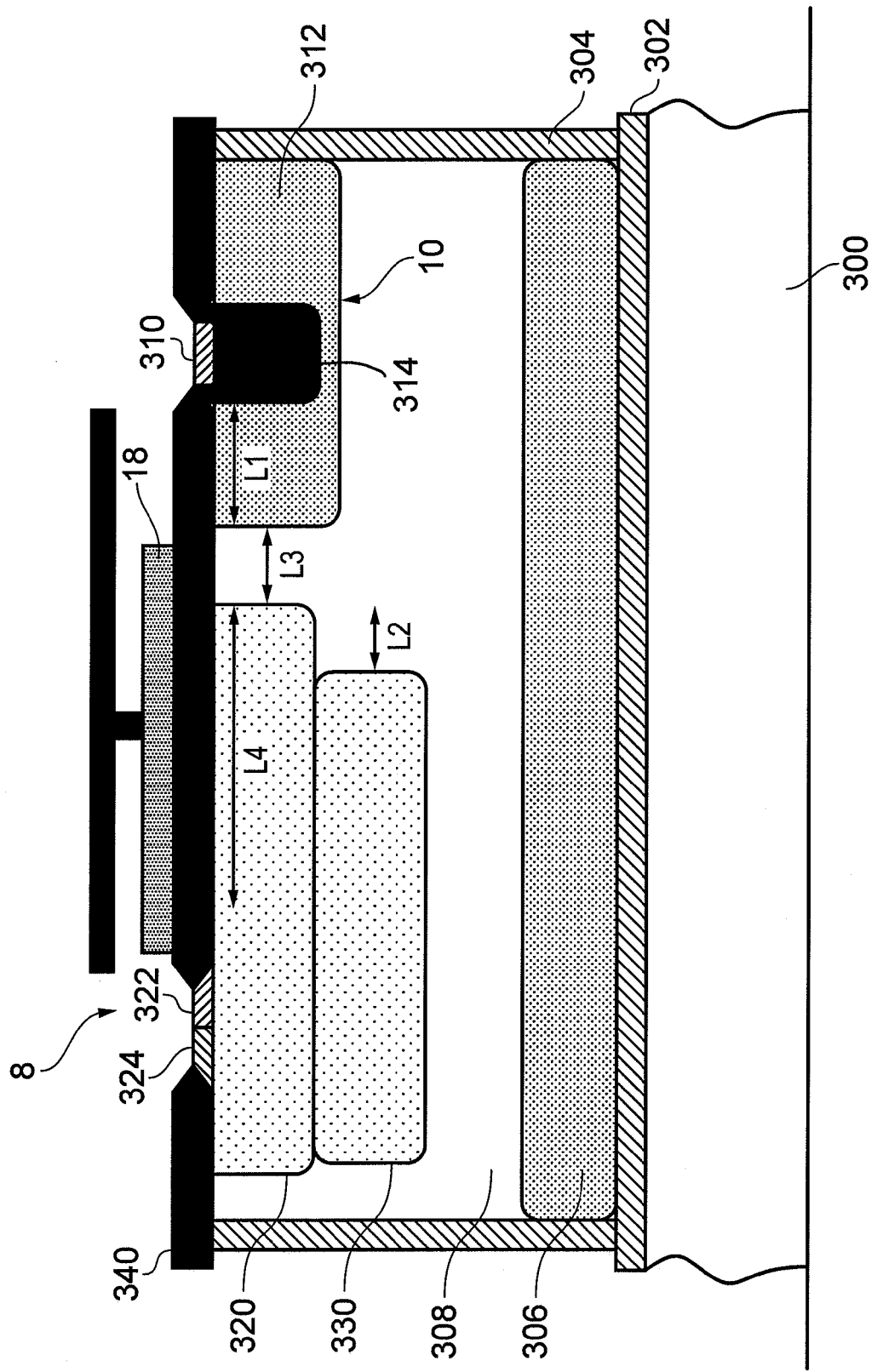
FIG. 10 is a schematic cross section illustrating an asymmetric field effect transistor in accordance with a further embodiment of the present invention.

FIG. 10 shows an asymmetric PMOS device in accordance with one embodiment. Some of the structures relating to controlling the influence of electric fields from beneath or above the device are the same as shown in the NMOS device of FIG. 1. Starting from the substrate 300, a silicon on insulator dielectric isolation layer 302, similar to layer 104 of FIG. 1, has been provided above the substrate. Insulating side walls 304, corresponding to the walls 102 in the device of FIG. 1, are provided. There is also a heavily doped buried layer 306, corresponding to the layer 150 of FIG. 1, which is formed before the first epitaxial growth occurs during device fabrication and which, in use, protects the device for handle wafer (i.e., substrate 300) bias voltages which may affect device performance at high voltages. In this example the buried layer 306 is P-type semiconductor.

Above the buried layer 306 is a well region 308, which in the illustrated example is a P-type layer formed by epitaxial growth over the layer 306.

The drain 10 is shown towards the right hand side of FIG. 10 and comprises a first drain region 310 of heavily doped P-type semiconductor formed within and surrounded by a well of less heavily doped semiconductor, also of P-type, which forms a second drain region 312. A highly doped plug forms a third drain region 314 extending beneath the first drain region 310 so as to inhibit current crowding at the corners of the first region 310. As discussed above, such current crowding and its attendant high electric field gradients can degrade the on-state performance of the device, which can give rise to an avalanche driven breakdown mechanism in the on-state. Similarly the second drain region 312 creates a low resistance P well around the first and third drain regions for enhanced current conduction in the on state while inhibiting current crowding, thereby reducing the risk of breakdown as a result of high current densities in the presence of high electric field gradients.

The source 8 and gate 18 are shown towards the left hand side and central regions of the device in FIG. 10. A lightly doped region 320 of N-type semiconductor forms the channel region and back gate of the device. The relatively low doping in this region 320 allows a depletion region to spread across it, thereby reducing the electric field gradients between the source and drain. The source 8 is formed as a heavily doped P type region 322 adjacent a heavily doped N type region 324, which forms a low resistance connection to the lightly doped region 320.

A deeper lightly doped well of N-type material 330 is provided beneath the lightly doped region 320. The region 330 does not extend as far towards the drain 10 as the lightly doped region 320 does, so there is an "overhang" designated L2 in FIG. 10. The provision of the deeper region 330 is used to prevent current crowding near the surface (i.e. the interface between the silicon and the oxide layer 340) so as to enhance on-state breakdown performance. The spacing L2 is used to modify the on state breakdown performance. When the deeper region 330 is not provided, the depletion region is allowed to spread upwardly as well as laterally to deplete the lightly-doped region 320 and therefore to dilute the electric field and increase the breakdown voltage. However this causes current crowding in the on state so the spacing L2 can be used to control this aspect of the device performance.

Thus, in both the NMOS and PMOS devices, an n-well 330 or 210 (FIG. 1) is provided, and a further overhanging N region 320 or 204 (FIG. 1) can be epitaxially grown over it. This allows the lightly doped N region 320, 210, to be extended more deeply into the semiconductor without suffering a high concentration of dopant atoms at the surface of the device.

The dimension L1 can control how much the depletion region can spread back from the channel, thereby reducing the electric fields resulting from applied voltages. Thus, the larger L1 is, the larger the breakdown voltage may be. The dimension L4 is the channel length, and can control the switching behavior of the device, such as threshold voltage and channel resistance.

Figure 11:
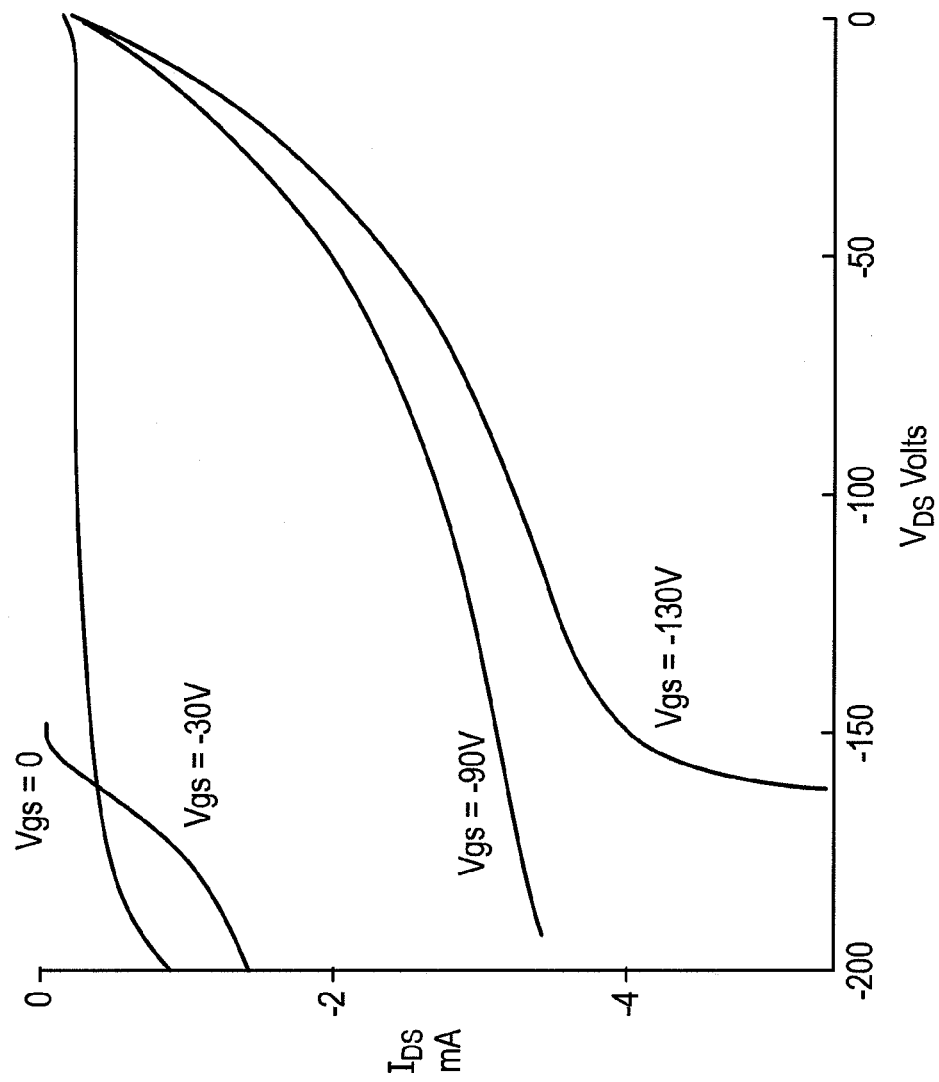
FIG. 11 shows $I_{DS}$ versus $V_{DS}$ characteristic curves for one example of a PMOS device in accordance with an embodiment of the present invention.

FIG. 11 shows a series of characteristic curves for one example of a PMOS transistor constituting an embodiment of the present invention. In this example: L1=3 µm, L2=2 µm, L3=3 µm, and L4=10 µm.

It can be seen that although the device was fabricated using a 40 V process offered by a fabricator (although there is a great deal of similarity between the 40 V process from different manufacturers), the device is relatively well behaved with $V_{DS}$ up to about −120 to −130 volts, and performance only starts to degrade for $V_{GS}$=−130 V after $V_{DS}$≈−130 V for lower $V_{GS}$ voltages, such as −90 V, the transistor does not fail until $V_{DS}$≈−180 volts.

Figure 12:
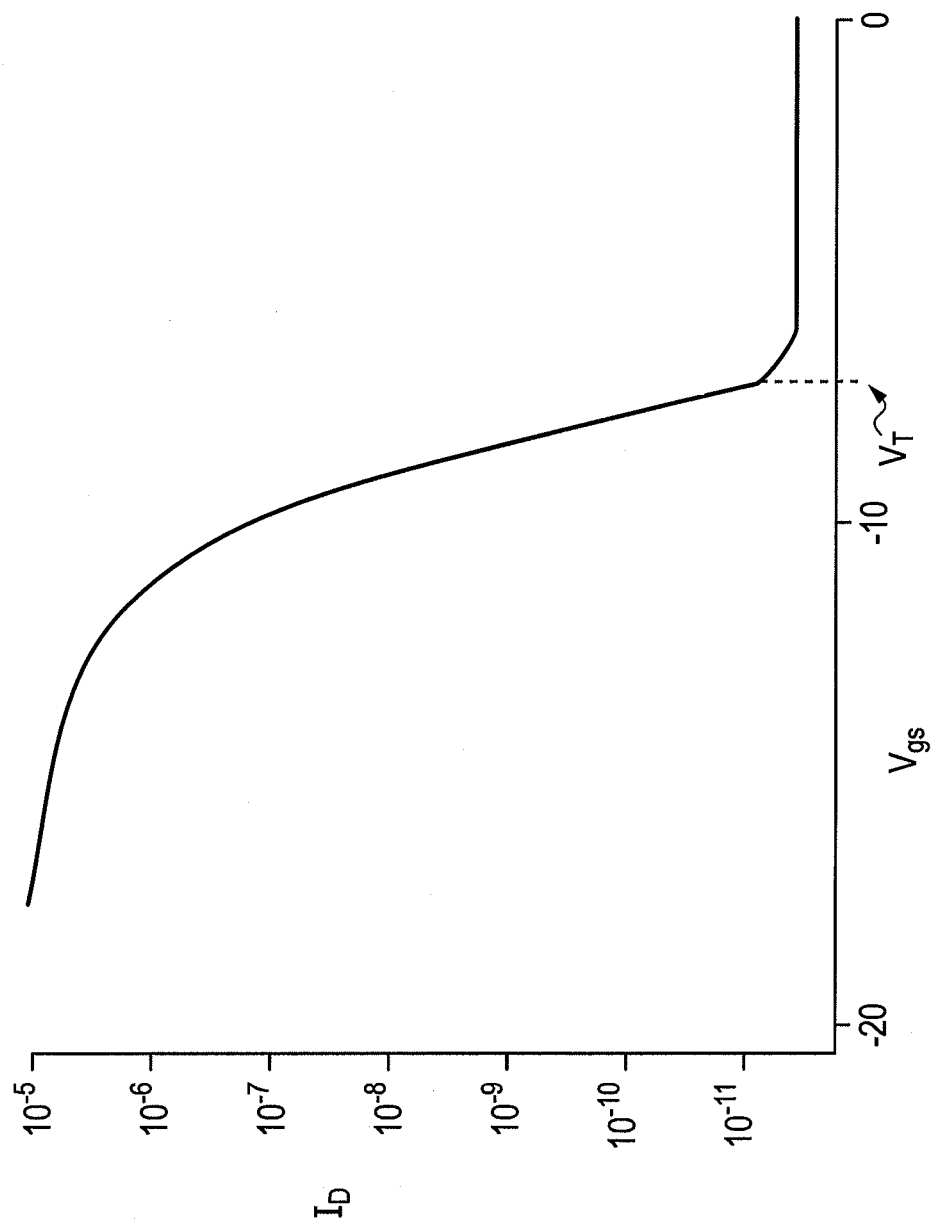
FIG. 12 is a plot of threshold voltage that shows the drain/source current as a function of gate voltage for an embodiment of the present invention.

FIG. 12 is a plot of drain current as a function of gate voltage for the PMOS transistor of FIGS. 10 and 11, showing that the threshold voltage $V_T$ is about −8 volts.

Figure 13:
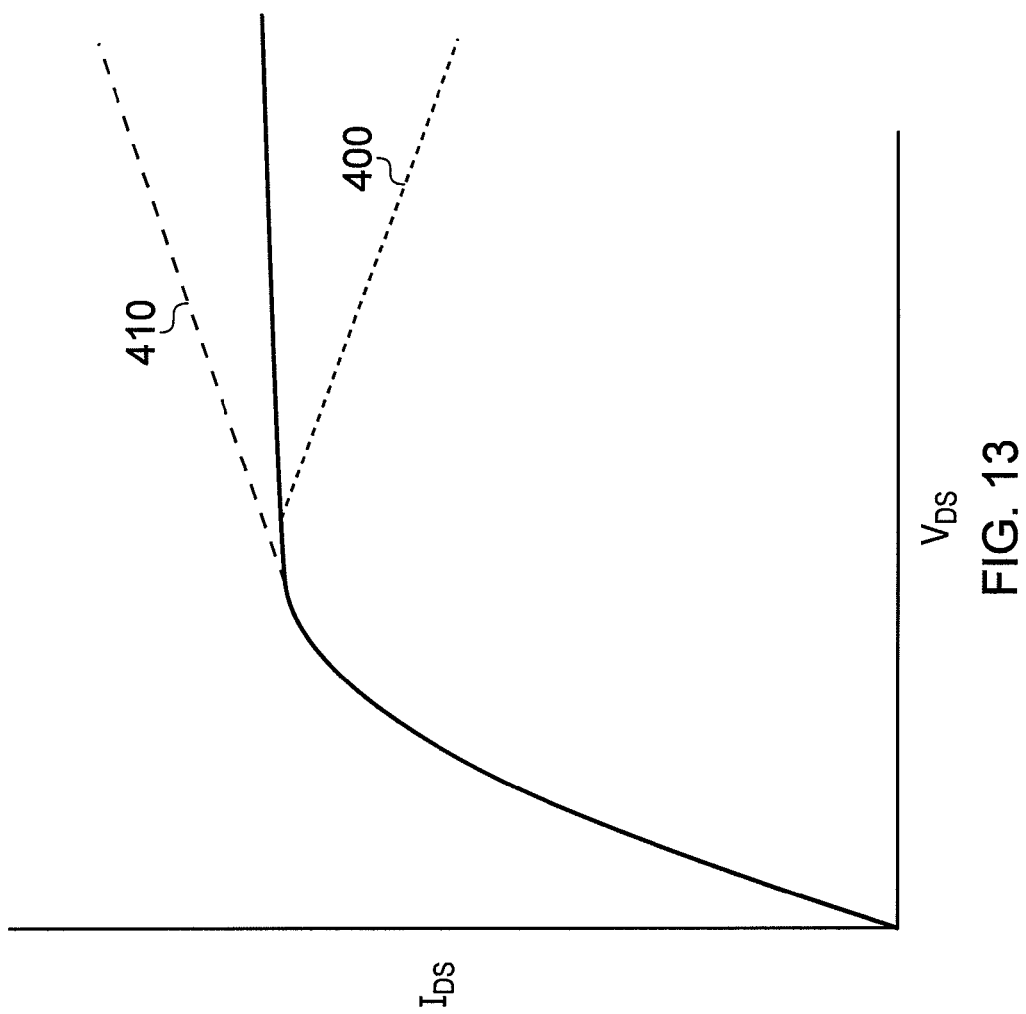
FIG. 13 schematically illustrates regions of device the $I_{DS}$ versus $V_{DS}$ characteristics as a result of heating and of channel length modulation.

For both the symmetric and asymmetric devices, device heating at larger $V_{DS}$ and current densities can cause the characteristic curves to "roll over,", as shown schematically by region 400, shown as a chain line in FIG. 13. This can be undesirable. However, it is also known that MOSFETs can exhibit a slope in the characteristic, designated by chain line 410, due to channel length modulation (also know as the Early effect). The distance for the depletion width spreading can be varied by adjusting the dimensions L3 and/or L4, so that the Early effect can be used to compensate for the heating effect so as to improve device performance. In one embodiment, L3 can be selected to be in the range of about 0 µm to about 7 µm.

For a given fabrication process, a designer can have a range of devices fabricated on a test chip so that performance can be characterized for the specific process. Thus, the dimension of, for example, L3 can be chosen using the test chip to achieve a suitable compromise between device performance and device size.

Figure 15:
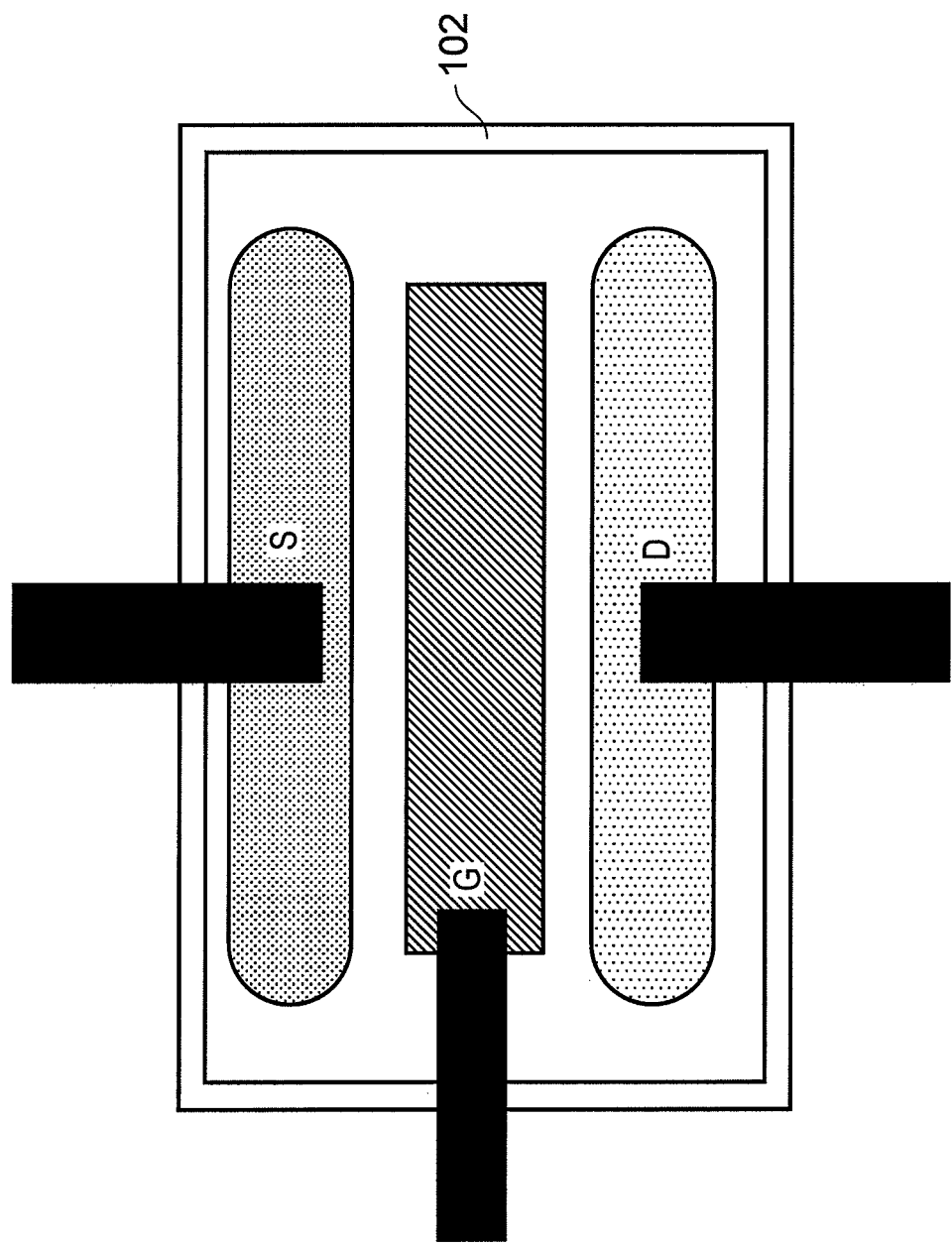
FIG. 15 is a plan view of a transistor in accordance with a further embodiment of the invention

In other embodiments, transistors do not exhibit rotational symmetry. FIG. 15 is a plan view of a device that does not exhibit rotational symmetry, but shows the source S, gate G and drain D positions. Although the source S and drain D are illustrated as being spaced from the gate G, additional regions of the source and drain (for example, second drain portion 204), can extend under the gate G. The doping structures of FIG. 1 or 10, including the gap or spacing L3 from either embodiment, can be applied to the transistor of FIG. 15.

It is thus possible, such as by the provision of additional structure within a field effect transistor, to fabricate a device having an enhanced breakdown voltage.

Devices employing the above described breakdown enhancement voltage schemes can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A method of forming a transistor, the method comprising:
   forming a drain and a source by doping a semiconductor with a first dopant type to form a first type of semiconductor, the drain and source being separated from one another;
   forming a gate region between the drain and source;
   forming a buried layer of a second type of semiconductor beneath the transistor;
   forming a plug region of the second type of semiconductor around the transistor;
   forming a screening element over the transistor, wherein the screening element is configured to shield the gate region from electric field gradients;
   wherein the drain comprises a first drain region of a first dopant concentration adjacent a second drain region, such that at least a portion of the second drain region is positioned between the first drain region and the source; and
   forming an intermediate region by doping the semiconductor so as to form the second type of semiconductor intermediate the drain and source, the intermediate region spaced apart from the second drain region.

2. A method as claimed in claim 1, in which the second drain region is doped at a lower concentration than the first drain region.

3. A method as claimed in claim 2, wherein the first drain region is formed as an area of increased doping concentration within the second drain region.

4. A method as claimed in claim 1, in which a third drain region having a doping concentration greater than that of the second drain region is provided beneath the first drain region and within the second drain region.

5. A method as claimed in claim 1, in which a fourth drain region is provided beneath the first and second drain regions.

6. A method as claimed in claim 5, in which the fourth drain region is overlapped by and narrower than the second drain region, such that the second drain region overhangs the fourth drain region.

7. A method as claimed in claim 1, in which an N-type region is provided beneath the first and second drain regions.

8. A method as claimed in claim 1, in which an N-type region is provided beneath the source.

9. A method as claimed in claim 1, in which the transistor has a first breakdown voltage but is fabricated using a process that normally provides transistors having a second breakdown voltage, the second breakdown voltage being less than the first breakdown voltage.

10. A method as claimed in claim 1, further comprising adjusting at least one of the size of the intermediate region and a spacing between the intermediate region and the second drain region such that, in the fabricated transistor, a channel length modulation effect is introduced into a drain-source current versus drain-source voltage transfer characteristic of the device to compensate for thermal effects within the device.

11. A method of forming a transistor as claimed in claim 1, in which a well forms a body region of the transistor and dopant densities in the first drain region, the second drain region, the source and the intermediate region are greater than dopant densities in the body region.

12. A field effect transistor comprising:
a source of a first type of semiconductor;
a drain of the first type of semiconductor, the drain comprising a first drain region of a first dopant concentration adjacent a second drain region, such that at least a portion of the second drain region is positioned between the first drain region and the source;
an intermediate region of a second type of semiconductor intermediate the drain and source and spaced apart from the second drain region;
a gate region disposed between the drain and source;
a plug region of the second type of semiconductor disposed around the transistor;
a buried layer of the second type of semiconductor disposed beneath the transistor; and
a screening element disposed over the transistor, wherein the screening element is configured to shield the gate region from electric field gradients.

13. A transistor as claimed in claim 12, wherein the second drain region is doped at a lower doping concentration than the first drain region.

14. A transistor as claimed in claim 13, in which a third drain region is provided in contact with the first drain region, extends into the second drain region, and has a doping concentration greater than the second drain region and less than the first drain region.

15. A transistor as claimed in claim 12, in which the transistor is insulated from a surrounding substrate by a dielectric, and the buried layer is provided proximate at least part of the dielectric.

16. A transistor as claimed in claim 12, in an integrated circuit.

17. A method of forming a transistor, the method comprising:
forming a well having a doping of a first type and a first doping concentration;
forming a source and a drain in the well, the source and drain having a doping of a second type opposite that of the first type, wherein the source and drain are spaced apart by a first distance;
forming an intermediate region in the well between the source and drain, the intermediate region having a doping of the first type and a second doping concentration, the second doping concentration greater than the first doping concentration, wherein the intermediate region is disposed between the source and drain and spaced apart from the drain by a second distance;
forming a gate electrode above the intermediate region;
forming a buried layer of first type of semiconductor beneath the transistor;
forming a plug region of the first type of semiconductor around the transistor; and
forming a screening element over the transistor, wherein the screening element is configured to shield the gate electrode from electric field gradients.

18. The method of claim 17, wherein the transistor is an n-type field effect transistor.

19. The method of claim 18, wherein the n-type field effect transistor has a first breakdown voltage, the method further comprising forming a second n-type field effect transistor in a second well, the second n-type field effect transistor including a gate, a source, and a drain, wherein the second n-type field effect transistor has a second breakdown voltage, the second breakdown voltage less than the first breakdown voltage.

* * * * *